(12) United States Patent
Tokuda et al.

(10) Patent No.: US 9,331,128 B2
(45) Date of Patent: May 3, 2016

(54) DISPLAY DEVICE AND MANUFACTURING METHOD THEREOF

(71) Applicant: Japan Display Inc., Tokyo (JP)

(72) Inventors: Naoki Tokuda, Tokyo (JP); Mitsuhide Miyamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/503,453

(22) Filed: Oct. 1, 2014

(65) Prior Publication Data

US 2015/0090993 A1    Apr. 2, 2015

(30) Foreign Application Priority Data

Oct. 2, 2013   (JP) .................. 2013-207211

(51) Int. Cl.
*H01L 27/32* (2006.01)
*H01L 51/50* (2006.01)

(52) U.S. Cl.
CPC ............ *H01L 27/3246* (2013.01); *H01L 51/50* (2013.01)

(58) Field of Classification Search
CPC .................................. H01L 27/3246
USPC ....................... 438/23, 38; 313/500
See application file for complete search history.

(56) References Cited

U.S. PATENT DOCUMENTS

| | | | |
|---|---|---|---|
| 2008/0042559 A1 | 2/2008 | Yamazaki | |
| 2009/0009068 A1* | 1/2009 | Fujimura | H01L 27/3276 313/504 |
| 2011/0198598 A1* | 8/2011 | Kim | H01L 27/3246 257/59 |
| 2014/0183460 A1* | 7/2014 | Kim | H01L 51/56 257/40 |
| 2014/0246685 A1* | 9/2014 | Miura | H01L 33/08 257/88 |
| 2014/0312323 A1* | 10/2014 | Park | H01L 51/525 257/40 |
| 2015/0060826 A1* | 3/2015 | Matsumoto | H01L 27/3246 257/40 |
| 2015/0090993 A1* | 4/2015 | Tokuda | H01L 27/3246 257/40 |

FOREIGN PATENT DOCUMENTS

| | | |
|---|---|---|
| JP | 2009-016231 A | 1/2009 |
| JP | 2012-22787 A | 2/2012 |
| KR | 2008-0004385 A | 9/2008 |
| KR | 2013-0046913 A | 2/2013 |

OTHER PUBLICATIONS

Korean Office Action dated Jan. 7, 2016 for corresponding KR application No. 10-2014-0130178.

* cited by examiner

*Primary Examiner* — Earl Taylor
(74) *Attorney, Agent, or Firm* — Typha IP LLC

(57) ABSTRACT

A display device, includes: a first substrate; an organic planarizing film that is made of an organic insulating material, and arranged on the first substrate; an electrode that comes in contact with a part of a surface of the organic planarizing film opposite to the first substrate side; an inorganic bank that is made of an inorganic insulating material, covers an end of the electrode, and comes in contact with a part of a surface of the organic planarizing film opposite to the first substrate side; an OLED layer that covers a side of the electrode and the inorganic bank opposite to a side that comes in contact with the organic planarizing film, and partially comes in contact with the organic planarizing film; and a sealing film that is configured to cover a side of the OLED layer opposite to the organic planarizing film side.

9 Claims, 13 Drawing Sheets

DISPLAY DEVICE AND MANUFACTURING METHOD THEREOF

CROSS-REFERENCE TO RELATED APPLICATION

The present application claims priority from Japanese patent application JP2013-207211 filed on Oct. 2, 2013, the content of which is hereby incorporated by reference into this application.

BACKGROUND OF THE INVENTION

1. Field of the Invention

The present invention relates to a display device and a method of manufacturing the display device.

2. Description of the Related Art

JP 2009-16231 A discloses an organic EL display device including a light emitting area having a lower electrode, an organic layer, and an upper electrode formed in the stated order, a peripheral area disposed in the periphery of the light emitting area, a protective film that covers the upper electrode, and a protective electrode that is electrically connected with the upper electrode, and arranged on an end of the peripheral area for allowing electric charge caused by formation of the protective film to flow out of the peripheral area.

Also, JP 2012-22787 A discloses an organic EL display device including light emitting elements having a function layer which are arranged on a substrate between a first electrode and a second electrode, a partition wall that partitions the function layer for each of light emission areas among the light emitting elements, and a drive circuit that drives the light emitting elements, in which at least a part of the drive circuit is arranged among the light emitting elements in a plane, and an area in which the partition wall is not disposed is present in an area where at least apart of the drive circuit overlaps with the light emitting elements in a plane.

SUMMARY OF THE INVENTION

The organic EL display device using organic light emitting diodes is provided with a structure called "bank" which is arranged around the respective pixel circuits and partitions the respective pixels. The bank is configured to cover an end of an electrode (anode) formed above a TFT substrate to have a function of preventing an electric short-circuiting between an anode and a cathode caused by a step disconnection of an organic EL film layer, and also partitioning light emission of the respective pixels.

For example, when a series of inorganic film is formed on a planarizing film made of an organic material, moisture within the planarizing film cannot be discharged, and the planarizing film and the inorganic film are separated by vaporized moisture.

An object of the present invention is to provide a display device and a method of manufacturing the display device which improve the reliability of an organic EL film layer.

Also, the above and other objects and novel features of the present invention will become apparent from the description of the present specification and the attached drawings.

In order to solve the above problem, according to the present invention, there is provided a display device including: a first substrate in which a plurality of pixel circuits each having a thin film transistor are arranged on an insulating substrate in a matrix; an organic planarizing film that is made of an organic insulating material, and arranged on the first substrate; an electrode that comes in contact with apart of a surface of the organic planarizing film opposite to the first substrate side; an inorganic bank that is made of an inorganic insulating material, covers an end of the electrode, and comes in contact with a part of a surface of the organic planarizing film opposite to the first substrate side; an OLED layer that covers a side of the electrode and the inorganic bank opposite to a side that comes in contact with the organic planarizing film, and partially comes in contact with the organic planarizing film; and a sealing film that is configured to cover a side of the OLED layer opposite to the organic planarizing film side.

Also, in order to solve the above problem, according to the present invention, there is provided a method of manufacturing a display device, including: forming a first substrate in which a plurality of pixel circuits each having a thin film transistor are arranged on an insulating substrate in a matrix as a first step; forming an organic planarizing film made of an organic insulating material on the first substrate as a second step; forming an electrode which comes in contact with a part of a surface of the organic planarizing film opposite to the first substrate side as a third step; forming an inorganic bank that is made of an inorganic insulating material, covers an end of the electrode, and comes in contact with a part of a surface of the organic planarizing film opposite to the first substrate side as a fourth step; and forming an OLED layer that covers a side of the electrode and the inorganic bank opposite to a side that comes in contact with the organic planarizing film, and partially comes in contact with the organic planarizing film as a fifth step.

According to the present invention, there is provided a display device and a method of manufacturing the display device which improve the reliability of the organic EL film layer.

DETAILED DESCRIPTION OF THE INVENTION

Figure 1A:
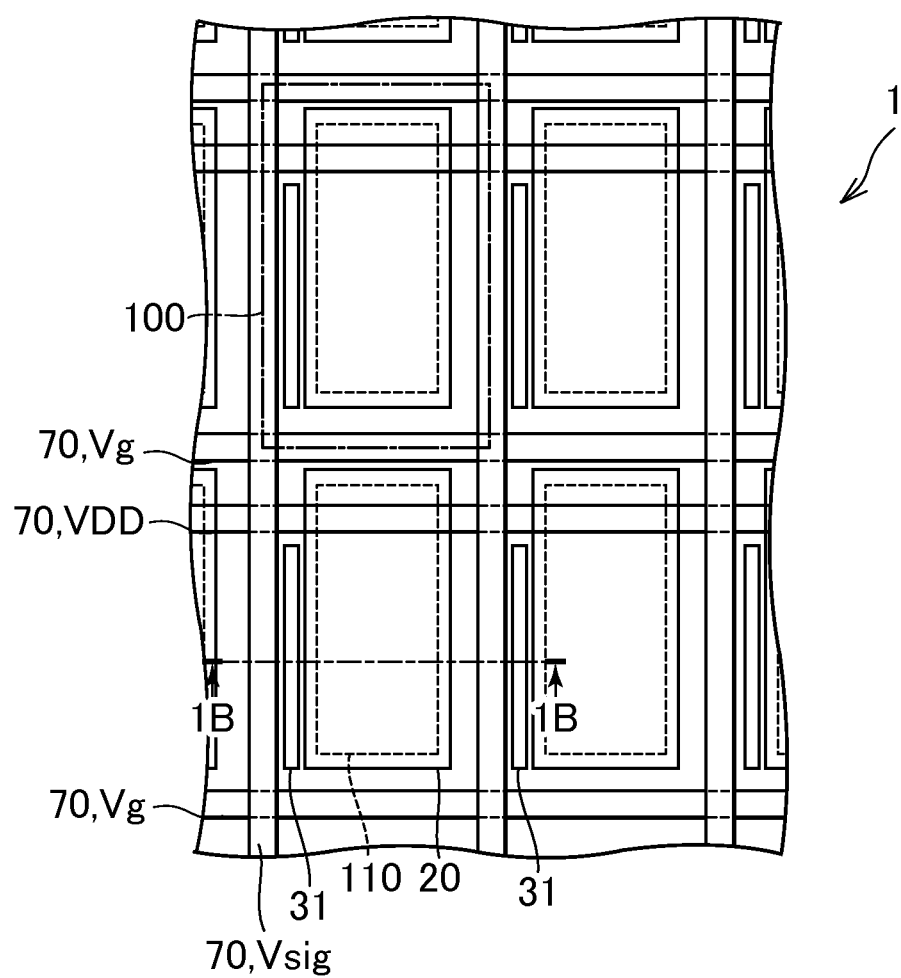
FIG. 1A is a plan view illustrating an organic EL display device according to a first embodiment of the present invention.

An organic EL display device using organic light emitting diodes is provided with a structure called "bank" which is arranged around the respective pixel circuits and partitions the respective pixels. The bank is configured to cover an end of an electrode (anode) formed above a TFT substrate to have a function of preventing an electric short-circuiting between an anode and a cathode caused by a step disconnection of an organic EL film layer, and also partitioning light emission of the respective pixels.

For example, in an organic EL display device of a top emission type, there is a need to reduce a surface step of a TFT substrate so as to form an organic EL film layer as smooth as possible. For that reason, a planarizing film is formed on the TFT substrate. In this example, in order to reduce the surface step of the TFT substrate over which the organic EL film layer is formed, it is desirable to form the planarizing film normally with a thickness of 2 μm to 3 μm taking an uneven difference of the step into account.

Logically, it is not impossible that the planarizing film is made of an inorganic material with the thickness of 2 μm to 3 μm. However, this manner is not realistic because time and effort are spent from the viewpoint of a process. Therefore, the planarizing film is normally made of an organic material such as acrylic resin or polyimide resin.

The electrode (cathode) configuring the organic EL film layer is formed on a part of an upper surface of the planarizing film, and the bank is formed to cover an end of the electrode, and the other surface of the upper surface of the planarizing film in which the electrode is not formed. In this example, the bank is normally formed to cover the overall other surface of the upper surface of the planarizing film on which the electrode is not formed. Conceivably, this is because when the bank is formed to cover the overall other surface of the upper surface of the planarizing film on which the electrode is not formed, the process is simple, and there is no real harm from the viewpoint of performance even if the bank is formed in the above manner.

Also, it is usual that the bank is made of the same material as that of the planarizing film. That is, because the planarizing film is made of the organic material such as acrylic resin or polyimide resin, the bank is similarly made of the organic material. This is because when the bank is made of the same material as that of the planarizing film, the process is simple, and affinity of the respective interfaces is high so that a reduction in the generation of separation of the respective layers from each other can be expected.

If a height of the bank is low, a distance (gap) between the bank and a counter substrate (color filter, etc.) is made shorter, and a precision of coloring (for example, RGB coloring precision) is improved, as a result of which color mixture can be reduced. In order to obtain the effect of reducing the color mixture, it is effective to form the bank with a thickness of 0.5 μm or smaller, preferably 0.2 μm to 0.3 μm. Because the inorganic material can be normally easily formed even if the film thickness is thin as compared with the organic material, the present inventors have considered that it is effective that the bank is made of the inorganic material for the purpose of obtaining this advantage.

However, the combination of the planarizing film made of the organic material with the bank made of the inorganic material suffers from problems described below.

The problem is that in a configuration where the electrode (anode) is formed on the planarizing film, and the bank is formed to cover an end of the electrode, and the other surface of the upper surface of the planarizing film in which the electrode is not formed, (vacuum) baking is implemented as preprocessing before migrating to a light emitting layer formation step for forming the organic EL film layer. This preprocessing is conducted for the purpose of removing the moisture because a large amount of moisture is contained in the organic material forming the planarizing film, and the moisture reduces the reliability of organic EL elements.

In this example, the electrode made of metal, and the bank made of the inorganic material are arranged on the upper surface of the planarizing film made of the organic material to cover the overall upper surface of the planarizing film. For that reason, when the (vacuum) baking is implemented, an escape of the moisture contained in the organic material forming the planarizing film is lost. For that reason, the moisture remaining without being volatilized to an external at the time of (vacuum) baking expands, and has the potential for causing the separation between the bank and the planarizing film, or between the electrode and the planarizing film.

The present inventors have earnestly studied the provision of a display device having the planarizing film made of the organic insulating material, and the bank made of the inorganic insulating material which improves the precision of coloring, and enables a reduction in the color mixture.

Hereinafter, a description will be given of a display device and a method of manufacturing the display device which improve the reliability of the organic EL film layer while reducing the color mixture.

First Embodiment

According to a first embodiment of the present invention, there is provided an organic EL display device including: a first substrate in which a plurality of pixel circuits each having a thin film transistor are arranged on an insulating substrate in a matrix; an organic planarizing film that is made of an organic insulating material, and arranged on the first substrate for planarizing irregularities of a surface of the first substrate; anodes that come in contact with a part of a surface of the organic planarizing film opposite to the first substrate side; an inorganic bank that is made of an inorganic insulating material, covers an end of the anodes, and comes in contact with apart of a surface of the organic planarizing film opposite to the first substrate side; an OLED layer that covers a side of the anodes and the inorganic bank opposite to a side that comes in contact with the organic planarizing film, and partially comes in contact with the organic planarizing film; and a sealing film that is configured to cover a side of the OLED layer opposite to the organic planarizing film side.

Figure 4:
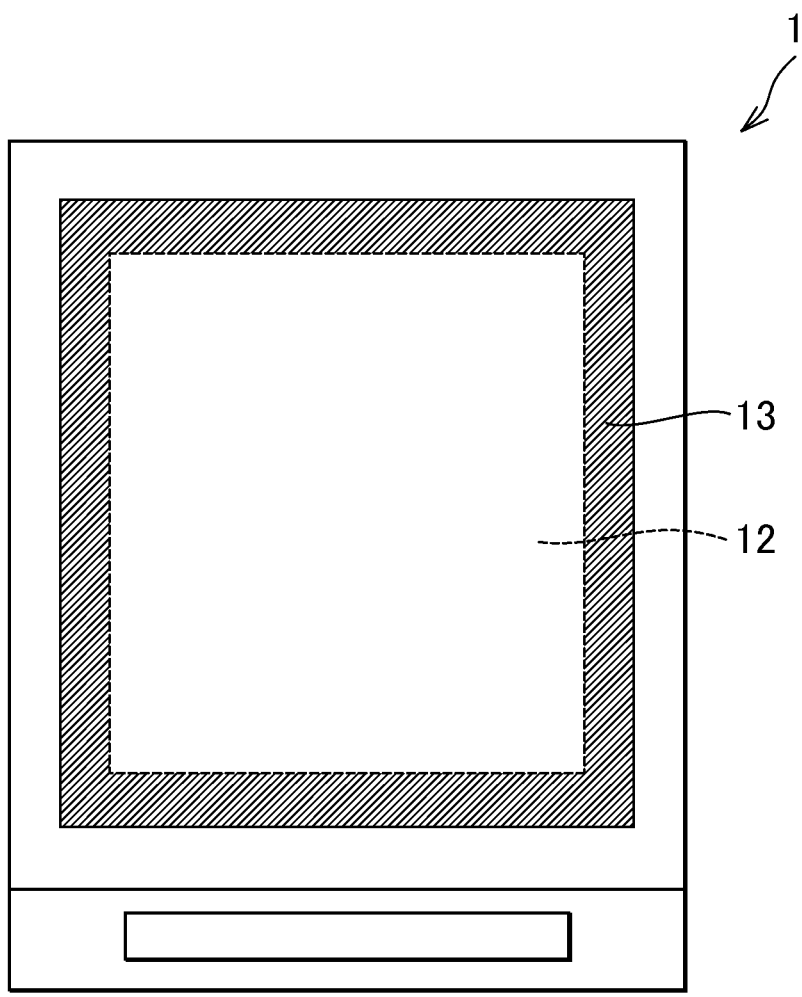
FIG. 4 is a plan view illustrating an organic EL display device according to an embodiment of the present invention.

Hereinafter the display device according to an embodiment of the present invention will be described with reference to the accompanying drawings. FIG. 1A is an enlarged plan view of a part of a pixel portion of an organic EL display device according to a first embodiment of the present invention. FIG. 4 is a plan view illustrating an organic EL display device 1 according to a first embodiment of the present invention. Pixels in FIG. 1A are arranged within a display area 12 of the organic EL display device 1 according to the first embodiment of the present invention illustrated in FIG. 4.

As illustrated in FIG. 1A, the organic EL display device 1 according to the embodiment of the present invention has a first substrate in which plural pixel circuits 100 each having a thin film transistor are arranged on an insulating substrate in a matrix. In the plan view, anodes 20 (pixel electrodes) are arranged at respective positions corresponding to the plural pixel circuits 100 arranged in a matrix, and pixel openings 110 are formed in partial or overall areas of the respective anodes 20

Lines 70 that partition the plural pixel circuits 100 in a matrix according to the present invention may be configured by, for example, gate electrode lines Vg (scanning lines), signal lines Vsig, and power supply lines VDD that supply a power to thin film transistors, which are connected to gate electrodes, source electrodes, and drain electrodes included in thin film transistors, respectively.

Also, in the organic EL display device 1 according to the first embodiment of the present invention, an OLED layer (not shown in FIG. 1A) 40 is disposed on upper surfaces of the anodes 20. The OLED layer (OLED: organic light emitting diode) 40 according to the present invention includes a cathode (transparent electrode: not shown in FIG. 1A), and a light emitting layer 40a. The light emitting layer 40a included in the OLED layer 40 is held between the cathode and the anodes 20 arranged at the respective positions corresponding to the plural pixel circuits 100 arranged in a matrix in the plan view.

The anodes 20 are supplied with a current through the thin film transistors disposed on the first substrate. The current that has been supplied to the anodes 20 flows into the cathode through the OLED layer 40 (light emitting layer). In the light emitting layer held between the anodes 20 and the cathode, electrons from the cathode and the holes from the anodes 20 are recombined with each other to emit light. The emitted light is applied to the external through the above pixel openings 110.

Figure 1B:
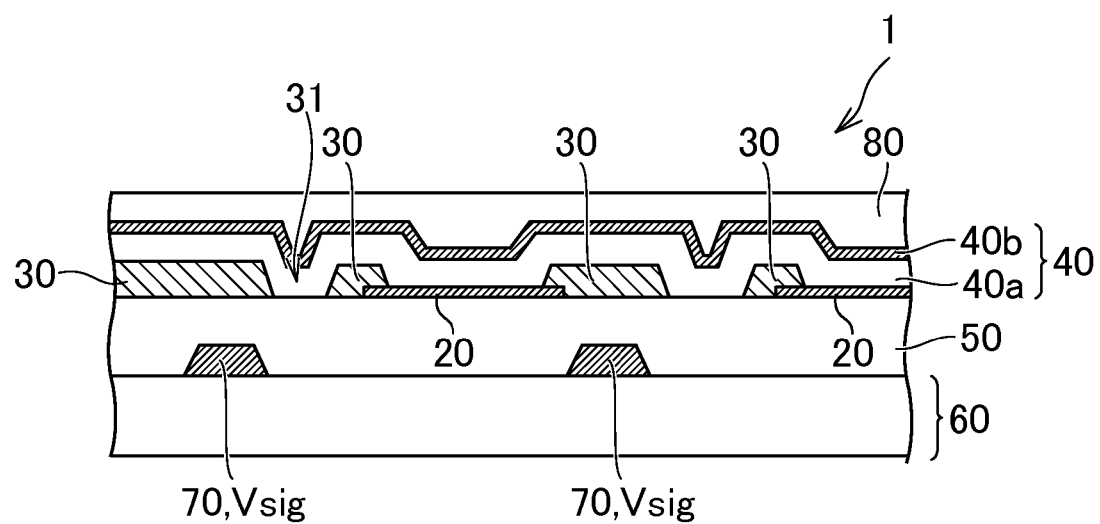
FIG. 1B is a cross-sectional view taken along a line 1B-1B in FIG. 1A.

FIG. 1B is a cross-sectional view taken along a line 1B-1B in FIG. 1A. A description will be given of a configuration of the organic EL display device 1 specifically according to the first embodiment of the present invention with reference to FIG. 1B.

The first substrate included in the organic EL display device 1 according to the first embodiment of the present invention is configured in such a manner that the plural pixel circuits 100 each having the thin film transistor are arranged in a matrix on the insulating substrate. In this example, the insulating substrate may be made of, for example, glass or plastic (polycarbonate, polyethylene terephthalate, polyimide, polyacrylate).

Also, the first substrate included in the organic EL display device 1 may be made of, for example, a light transmissive material. In this example, the light transmissive material may be made of glass, plastic (polycarbonate, polyethylene terephthalate, polyimide, polyacrylate), ITO, or IZO, but is not limited to those materials.

Also, a first substrate 60 on which the thin film transistors are arranged is also called "TFT (thin film transistor) substrate". In this example, each of the thin film transistors may include a semiconductor film made of polysilicon, agate insulating film that covers a semiconductor film, the gate electrode arranged above the semiconductor film through the gate insulating film, and the source electrode and the drain electrode which penetrate the gate insulating film to be electrically connected to the semiconductor film. Also, a drive circuit (not shown) for driving the thin film transistors arranged on the first substrate 60 may be arranged on the first substrate 60.

Also, the lines 70 that partition the above-mentioned pixel circuits 100 are disposed on the first substrate 60. The lines 70 may be configured by, for example, the gate electrode lines Vg (scanning lines), the signal lines Vsig, and the power supply lines VDD that supply a power to thin film transistors, which are connected to the gate electrodes, the source electrodes, and the drain electrodes included in thin film transistors, respectively.

The lines 70 may be made of metal such as aluminum (Al), chromium (Cr), or molybdenum (Mo).

A planarizing film 50 included in the organic EL display device 1 according to the present invention is made of an organic insulating material, and arranged on the first substrate 60. Also, an upper surface of the planarizing film 50 is planarized, and the upper surface of the planarizing film 50 is flatter than irregularity of a surface of a layer formed on a lower side (first substrate 60 side) of the planarizing film 50. For example, in the organic EL display device of the top emission type, there is a need to reduce surface steps of the TFT substrate so that the OLED layer 40 becomes as smooth as possible. For that reason, the organic planarizing film 50 is formed on the TFT substrate.

That is, because the lines 70 that partition the pixel circuits 100 are disposed on the first substrate 60, irregularities caused by a thickness of the lines 70 are present on the surface of the first substrate 60. The presence of the irregularities makes it difficult to form the anodes 20 and the OLED layer 40 over the first substrate 60 due to step disconnections. For that reason, in order to reduce the irregularities on the first substrate 60, the organic planarizing film 50 is disposed on the first substrate 60.

In this example, in order to reduce the surface steps of the TFT substrate on which the OLED layer 40 is formed, the organic planarizing film 50 may be formed with a thickness of 1.5 μm or larger and 3.5 μm or smaller, taking the irregularity difference of the steps into consideration. Also, it is preferable that the organic planarizing film 50 is formed with the thickness of 2 μm or larger, and further it is preferable that the planarizing film 50 is formed with the thickness of 3 μm or smaller.

Also, logically, it is not impossible that the organic planarizing film 50 is made of an inorganic material with the thickness of 1.5 μm or larger and 3.5 μm or smaller. However, this manner is not realistic because time and effort are spent from the viewpoint of a process. Therefore, the organic planarizing film 50 included in the organic EL display device 1 according to the present invention is made of an organic insulating material. More specifically, the organic planarizing film 50 included in the organic EL display device 1 according to the present invention may be made of an organic insulating material selected from a compound group consisting of acrylic resin, polyimide resin, novolac resin, and a mixture of those components.

Also, the organic planarizing film 50 included in the organic EL display device 1 may be formed by, for example, coating the irregularity surface with varnish of an organic resin (liquid product in which organic resin is dissolved in a solvent), and evaporating the solvent contained in the varnish. When the organic planarizing film 50 is thus formed, the varnish flows into recesses of the first substrate 60 surface preferentially, to thereby effectively planarize the irregularities of the surface of the first substrate 60.

When the organic planarizing film 50 is made of polyimide resin, processing of imidization may be thereafter conducted. Also, when the organic planarizing film 50 is made of an organic thermosetting resin, a heat treatment may be thereafter conducted to facilitate thermosetting. Also, when the organic planarizing film 50 is made of an organic photocurable resin, alight irradiation treatment may be thereafter conducted to facilitate light curing. A material and a formation method of the organic planarizing film 50 are not limited to the above configuration.

The anodes 20 (pixel electrodes) are arranged on the organic planarizing film 50 for planarizing the irregularities of the first substrate 60 surface. That is, the anodes 20 come in contact with a part of a surface of the organic planarizing film 50 opposite to the first substrate 60 side.

Because the anodes 20 function to inject holes into the organic layers such as a hole injection layer or a hole transport layer included in the OLED layer 40, there is a need to increase a work function. For example, the anodes 20 may be made of tin oxide ($SnO_2$), zinc oxide doped with aluminum (ZnO:Al), indium tin oxide (ITO), or indium zinc oxide ($In_2O_3$—ZnO(IZO)). Because the work function of ITO is about 4.6 to 5.0 eV, and close to an HOMO level (5.0 to 5.5 eV) of the hole transport material, ITO is suitable for the injection of holes.

Each of the inorganic banks 30 included in the organic EL display device 1 is provided to cover an end of the anode 20, and come in contact with a part of a surface of the organic planarizing film 50 opposite to the first substrate 60 side. Usually, each of the inorganic banks 30 is formed to cover the ends of the anodes 20, and the other overall surface of the upper surface of the organic planarizing film 50 in which the anodes 20 are not formed. The reason that the inorganic bank 30 is formed to cover the other overall surface of the upper surface of the organic planarizing film 50 in which the anodes 20 are not formed is because it is conceivable that the process is simple, and there is no real harm from the viewpoint of performance.

However, in this embodiment, the bank 30 does not cover the other overall surface of the upper surface of the organic planarizing film 50 in which the anodes 20 are not formed, and openings 31 are formed in parts of the inorganic layer. For that reason, the bank 30 is formed to expose a part of the upper surface of the organic planarizing film 50 so as to come in contact with the OLED layer 40 without covering the other overall surface of the upper surface of the organic planarizing film 50 in which the anodes 20 are not formed.

Also, the bank 30 is made of the same material as the organic planarizing film 50. That is, when the organic planarizing film 50 is normally made of an organic material such as acrylic resin or polyimide resin, the bank 30 is also made of the organic material, likewise. However, in the present invention, the bank 30 is made of a material different from that of the organic planarizing film 50, and made of an inorganic insulating material.

This is because a height of the bank 30 made of the inorganic insulating material can be formed to be lower than the height of the bank made of the organic insulating material. When the bank 30 of the low height is formed, a distance (gap) between the bank 30 and a counter substrate (color filter, etc.) is made shorter, and a precision of coloring is improved, as a result of which color mixture can be reduced.

Also, in order to obtain the effect of reducing the color mixture, it is effective to form the bank 30 with a thickness of 0.15 μm or larger, and 0.35 μm or smaller. Therefore, the height of the bank 30 included in the organic EL display device 1 according to the present invention may be set to be equal to or larger than 0.15 μm, and equal to or smaller than 0.35 μm. Also, the height of the bank 30 may be set to be equal to or smaller than 0.5 μm, or may be set to be equal to or larger than 0.2 μm, and equal to or smaller than 0.3 μm.

Also, the inorganic insulating material of the bank 30 may be selected from a group consisting of silicon nitride, silicon oxide, and a mixture thereof. Also, the bank 30 may be made of silicon nitride or silicon oxide.

Also, the bank 30 performs a function of covering the end of the anodes 20 separated for each of the pixels to define the light emission areas. That is, each outer edge of the pixel openings 110 is determined by the bank 30 that covers the end of the anode 20. Also, the banks 30 may be located at positions corresponding to a black matrix (not shown) provided on a color filter substrate (not shown) that faces the first substrate 60 through the OLED layer 40.

Also, the bank 30 is configured to cover the step of the end of the anodes 20 formed above the first substrate 60 to perform a function of preventing short-circuiting between the anode 20 and the cathode 40b caused by a step disconnection of the light emitting layer 40a included in the OLED layer 40. For that reason, the bank 30 may be formed with a smooth curved surface.

The OLED layer 40 included in the organic EL display device 1 includes the cathode 40b (transparent electrode) and the light emitting layer 40a as described above. The light emitting layer 40a included in the OLED layer 40 is held between the cathode 40b and the anodes 20 arranged at the respective positions corresponding to the plural pixel circuits 100 arranged in a matrix in the plan view. The anodes 20 are supplied with a current through the thin film transistors disposed on the first substrate 60. The current that has been supplied to the anodes 20 flows into the cathode 40b through the light emitting layer 40a. In the light emitting layer 40a held between the anodes 20 and the cathode 40b, electrons from the cathode 40b and the holes from the anodes 20 are recombined with each other to emit light. The emitted light is applied to the external through the above pixel openings 110.

The cathode 40b is a solid electrode formed on an uppermost surface (a surface of the OLED layer 40 opposite to the first substrate 60 side) of the OLED layer 40. The cathode 40b is formed over the substantially overall surface of a display surface of the organic EL display device 1.

In order to inject electrons into the organic layer, it is advantageous that the work function of the cathode 40b is smaller. For that reason, it is generally preferable that the cathode 40b is made of metal such as Al, Mg, MgAg, or MgIn. In the organic EL display device 1 of the top emission type such as the organic EL display device 1 according to this embodiment, since the light emitted from the OLED layer 40 is extracted from the cathode 40b side, the cathode 40b may be formed of a transparent electrode made of a transparent metal such as indium tin oxide (ITO) or indium zinc oxide ($In_2O_3$—ZnO(IZO)).

The organic EL display device 1 includes a sealing film 80 provided to cover a side of the OLED layer 40 opposite to the organic planarizing film 50 side. The sealing film 80 is provided for protecting the OLED layer 40 from moisture or oxygen from the external. Therefore, a material of the sealing film 80 is selected taking water permeability and air permeability into account.

For example, the sealing film 80 may be made of an inorganic material. Also, the sealing film 80 may be made of a compound selected from a group consisting of SiN, $SiO_2$, $P_2O_5.SiO_2$(PSG), $Al_2O_3$, $PbO.SiO_2$, $Si_3N_4$, SiON, $PbO.B_2O_3$, and a mixture of those materials. Also, the sealing film 80 is made of the organic material, and may be made of, for example, polyimide resin and/or derivative thereof. In particular, it is preferable that the sealing film 80 is made of SiN. Also, the sealing film 80 may be deposited by, for example, CVD. The material and the forming method of the sealing film 80 are not limited to the above example.

Also, a thickness of the sealing film 80 may be set to 0.5 μm to 10 μm. If the thickness of the sealing film 80 is set to 0.5 μm to 10 μm, the effect of protecting the OLED layer 40 is enhanced, which is preferable.

If the sealing film 80 is smaller than 0.5 μm, a hole is likely to open in the film. Also, if the sealing film 80 is smaller than 0.5 μm, a waterproof function is impaired. If the sealing film 80 is equal to or larger than 3.0 μm, dust is likely to be coated, which is preferable. Also, if the sealing film 80 is larger than 10 μm, a distance between the color filter arranged to face the TFT substrate and the light emitting surface becomes longer, and color mixture is generated. If the sealing film 80 is larger than 10 μm, there arise such problems that a manufacturing time becomes longer, a film stress becomes larger, and the uniformity of the film is deteriorated.

As illustrated in FIGS. 1A and 1B, the opening 31 where the inorganic bank 30 is not formed between the respective pixels is formed in the inorganic layer. With this configuration, the organic EL display device 1 according to this embodiment has a structure in which apart of the OLED layer 40 comes in direct contact with the organic planarizing film 50.

The OLED layer 40 in the organic EL display device 1 according to this embodiment comes in direct contact with the organic planarizing film 50 at places other than an area in which the organic planarizing film 50 overlaps with the anodes 20 in a plan view whereby moisture contained in the organic insulating material forming the organic planarizing film 50 is removed by implementing (vacuum) baking. As a result, the moisture is evaporated to the external from the area in which the OLED layer 40 and the organic planarizing film 50 come in direct contact with each other, and the generation of separation between the bank 30 and the organic planarizing film 50, or between the electrode and the organic planarizing film 50 can be suppressed.

Also, although will be described in the description of a second embodiment in detail later, the first substrate has lines that partition the plural pixel circuits in a matrix, and the OLED layer 40 and the organic planarizing film 50 may come into contact with each other in areas that overlap with the lines. The OLED layer 40 and the organic planarizing film 50 come into contact with each other in the areas that overlap the lines which partition the plural pixel circuits in a matrix in the plan view, to thereby enable the space of the pixel circuits to be saved, or the pixel openings 110 to increase.

Now, a manufacturing process for the organic EL display device 1 will be described specifically, and a step of removing moisture contained in the organic insulating material forming the organic planarizing film 50 by implementing baking in a vacuum will be described specifically.

Figure 2:
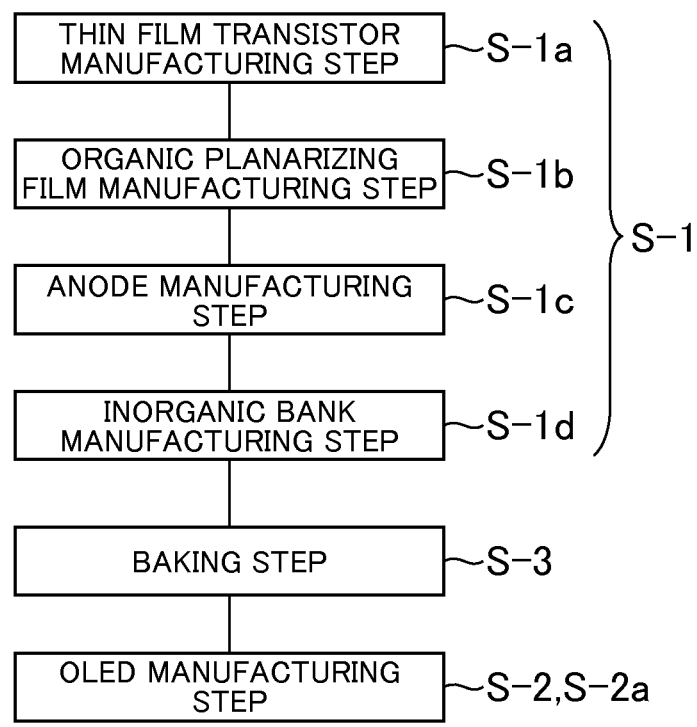
FIG. 2 is a diagram illustrating a manufacturing process of the organic EL display device according to the first embodiment of the present invention.

FIG. 2 is a diagram illustrating a manufacturing process of the organic EL display device 1 according to the first embodiment of the present invention. As illustrated in FIG. 2, the manufacturing process of the organic EL display device 1 is roughly classified into a TFT step (S-1), and an OLED step (S-2). Because it is conceivable that the anodes 20 and the bank 30 formed on the organic planarizing film 50 naturally form the OLED layer 40, the step of forming the anodes 20 and the bank 30 may be included in an OLED step (S-2). However, in the present invention, for convenience of description, the following description will be made assuming that the step of forming the anodes 20 formed on the organic planarizing film 50, and the bank 30 is included in a TFT step (S-1).

The TFT step includes a first step S-1a of forming the first substrate 60 in which the plural pixel circuits 100 each having the thin film transistor are arranged on the insulating substrate in a matrix, a second step S-1b of forming the organic planarizing film 50 made of the organic insulating material for planarizing the irregularities of the surface of the first substrate 60 on the first substrate 60, a third step S-1c of forming the anodes 20 forming the OLED layer 40, which comes in contact with a part of a surface of the organic planarizing film 50 opposite to the first substrate 60 side, and a fourth step S-1d of forming the bank 30 made of the inorganic insulating material, which forms the inorganic layer, to cover the end of the anodes 20, and the surface of the organic planarizing film 50 opposite to the first substrate 60 side. Also, the fourth step S-1d includes the step of forming the openings 31 in the inorganic layer, and exposing a part of the surface of the organic planarizing film 40 opposite to the first substrate 60 side.

The first step S-1a (thin film transistor manufacturing step in FIG. 2) of forming the first substrate 60 in which the plural pixel circuits 100 each having the thin film transistor are arranged on the insulating substrate in a matrix may be conducted through a known photolithographic technology (PEP or lithography).

Then, the second step S-1b (organic planarizing film manufacturing step in FIG. 2) of forming the planarizing film 50 that planarizes the irregularities of the surface of the first substrate 60 obtained by the above-mentioned first step S-1a by the organic insulating material is conducted.

The organic planarizing film 50 may be formed by coating the irregularity surface with varnish of an organic resin (liquid product in which organic resin is dissolved in a solvent) to allow the varnish to flow into the recesses preferentially, and then drying the varnish. Also, the varnish of the organic resin may be coated through a method such as a spin coater or a slit coater, but is not limited to the above methods.

Then, the third step S-1c (anode manufacturing step in FIG. 2) of forming the anodes 20 which form the OLED layer 40, which come into contact with a part of the surface of the organic planarizing film 50 formed through the above-mentioned second step S-1b opposite to the first substrate 60 side is conducted. In order to remove moisture contained in the organic planarizing film 50 formed before the third step S-1c and after the second step S-1b, a braking (or vacuum baking) process may be conducted, for example, under a condition of 200° C.

Because the organic planarizing film 50 is made of the organic insulating material, the organic planarizing film 50 may absorb the moisture in the atmosphere. Therefore, for the purpose of removing the moisture contained in the organic planarizing film 50 before a process described below, baking (or vacuum baking) process may be conducted.

The anodes 20 may be made of tin oxide ($SnO_2$), zinc oxide doped with aluminum (ZnO:Al), indium tin oxide (ITO), or indium zinc oxide ($In_2O_3$—ZnO(IZO)), and may be formed through a known photolithographic technology (PEP or lithography).

Then, the fourth step S-1d (bank manufacturing step in FIG. 2) of forming the bank 30 which covers the end of the anodes 20 formed through the above-mentioned third step S-1c, and the surface of the organic planarizing film 50 opposite to the first substrate 60 side to configure the OLED layer 40 by the inorganic insulating material is conducted. The bank 30 may be made of the inorganic insulating material selected from a group consisting of SiN, SiO, and a mixture of those materials, and the bank 30 may be formed through, for example, a CVD method.

In the fourth step S-1d, first, the solid bank 30 is formed to cover the end of the anodes 20 and the overall surface of the organic planarizing film 50 opposite to the first substrate 60 side in which the anodes 20 are not formed. Thereafter, in the fourth step S-1d, a step of forming the openings 31 in the solid bank 30, and exposing a part of the surface of the organic planarizing film 50 opposite to the first substrate 60 side is conducted.

Although will be described in detail later, the openings 31 formed in the fourth step are to ensure the escape of moisture so that the escape of the moisture contained in the organic material forming the organic planarizing film 50 is prevented from being lost in implementing (vacuum) baking before the OLED step S-2 when the bank 30 is arranged to cover the overall upper surface of the organic planarizing film 50. When the escape of moisture is thus ensured, the moisture is evaporated to the external without remaining within the organic planarizing film and expanding at the time of (vacuum) baking, to thereby lead to a reduction in a risk of causing the separation between the bank and the planarizing film, or between the electrode and the planarizing film.

After passing through the above first step S-1a to fourth step S-1d, the TFT step S-1 is completed, and the flow proceeds to the OLED step S-2. In this situation, it is conceivable that a contaminant of fine gains or molecular level may adhere to the obtained TFT substrate. Because the contaminant of this type may cause the deterioration of device characteristics, it is preferable to conduct a cleaning step for removing the contaminant of this type.

Therefore, after the fourth step S-1d, a step of cleaning the obtained TFT substrate with the use of pure water is conducted. The cleaning step may be appropriately conducted together with a brush scrub cleaning, ultrasonic cleaning, or high-pressure jet cleaning.

The OLED step S-2 includes a fifth step S-2a (OLED manufacturing step in FIG. 2) of forming the light emitting layer 40a that contacts and covers a part of the surface of the organic planarizing film 50 opposite to the first substrate 60 side, which is exposed by the formation of the openings 31 in the inorganic layer, and the surface of the bank 30 opposite to the organic planarizing film 50 side.

In this situation, before the fifth step S-2a, (vacuum) baking may be implemented as a preprocessing, on the TFT substrate obtained in the above TFT step. This is because a large amount of moisture is contained in the organic material forming the organic planarizing film 50 by the above cleaning step, the moisture lowers the reliability of the organic EL element, and therefore the moisture is removed. That is, the method of manufacturing the organic EL display device 1 may include a baking step S-3 of evaporating the moisture contained in the organic material forming the organic planarizing film 50 from the openings 31 of the inorganic layer formed in the fourth step S-1d, and removing the moisture, between the fourth step S-1d and the fifth step S-2a.

Also, the baking step S-3 may include a vacuum baking step. This is because the moisture contained in the organic material forming the organic planarizing film 50 is more surely removed by the execution of the vacuum baking step.

The fifth step S-2a forms the OLED layer 40 that covers one side of the anodes 20 and the bank 30 opposite to the other side that contacts the organic planarizing film 50, and partially contacts the organic planarizing film 50. That is, the fifth step S-2a is a step of forming the OLED layer 40 that contacts and covers a part of the surface of the organic planarizing film 50 opposite to the first substrate 60 side, which is exposed by the formation of the openings 31 of the inorganic layer, and the surface of the bank 30 opposite to the organic planarizing film 50 side.

The OLED layer 40 (OLED: organic light emitting diode) according to the present invention includes the cathode 40b (transparent electrode), and the light emitting layer 40a as described above, the light emitting layer 40a contained in the OLED layer 40 is held between the cathode 40b and the anodes 20 arranged at the respective positions corresponding to the plural pixel circuits 100 which are arranged in a matrix in the plan view.

Also, because the light emitting layer 40a is made of an organic material, the light emitting layer 40a may be formed through, for example, a known coating method. Also, the cathode 40b (transparent electrode) may be formed through a known vapor deposition method such as CVD.

The organic EL display device 1 according to the first embodiment described above is a display device that improves the reliability of the organic EL film layer.

Also, the display device manufactured by the method of manufacturing the organic EL display device 1 described above includes: the first substrate 60 in which the plural pixel circuits 100 each having the thin film transistor are arranged on the insulating substrate in a matrix; the organic planarizing film 50 that is made of an organic insulating material, and arranged on the first substrate 60 for planarizing the irregularities of the surface of the first substrate 60; the anodes 20 that come in contact with a part of the surface of the organic planarizing film 50 opposite to the first substrate 60 side; the inorganic bank 30 that is made of the inorganic insulating material, covers the end of the anodes 20, and comes in contact with a part of the surface of the organic planarizing film 50 opposite to the first substrate 60 side; the OLED layer 40 that covers a side of the anodes 20 and the inorganic bank 30 opposite to a side that comes in contact with the organic planarizing film 50, and partially comes in contact with the organic planarizing film 50; and the sealing film 80 that is configured to cover a side of the OLED layer 40 opposite to the organic planarizing film 50 side. The OLED layer 40 may come in direct contact with the surface of apart of the organic planarizing film 50 through the inorganic bank openings 31 formed in the inorganic bank 30.

When the bank is made of the organic material, because a moisture content is increased as compared with a case the bank is made of the inorganic material, the reliability of the OLED layer (organic EL film layer) whose deterioration is promoted by the moisture is lowered. Also, because the bank made of the organic material is thicker than the bank made of the inorganic material, there is a risk that optical color mixing that the light emitted from the OLED layer is output from the adjacent pixel.

Therefore, the organic EL display device 1 according to the first embodiment having the organic planarizing film 50 made of the organic insulating material, and the inorganic bank 30 made of the inorganic insulating material is a display device that reduces the color mixture and improves the reliability of the organic EL film layer.

Second Embodiment

The organic EL display device 1 according to this embodiment includes: a first substrate 60 in which plural pixel circuits 100 each having a thin film transistor are arranged on an insulating substrate in a matrix; a planarizing film 50 that is made of an organic insulating material, and arranged on the first substrate 60 for planarizing irregularities of a surface of a layer formed on the first substrate 60; anodes 20 that come in contact with a part of a surface of the planarizing film 50 opposite to the first substrate 60 side; a bank 30 that is made of an inorganic insulating material, covers an end of the anodes 20, and comes in contact with a part of the surface of the planarizing film 50 opposite to the first substrate 60 side;

an OLED layer 40 that covers a side of the anodes 20 and the bank 30 opposite to a side that comes in contact with the planarizing film 50, and partially comes in contact with the planarizing film 50; and a sealing film 80 that is configured to cover a side of the OLED layer 40 opposite to the planarizing film 50 side, in which the first substrate 60 has lines 70 for partitioning the plural pixel circuits 100 in the matrix, and the OLED layer 40 and the planarizing film 50 come in contact with each other in an area that overlaps with the lines 70 in a plan view.

The lines 70 that partition the plural pixel circuits 100 in the matrix according to the second embodiment may be configured by any lines 70 selected from the gate electrode lines Vg (scanning lines), the signal lines Vsig, and the power supply lines VDD that supply a power to the thin film transistors, which are connected to the gate electrodes, the source electrodes, and the drain electrodes included in thin film transistors, respectively.

Figure 3A:
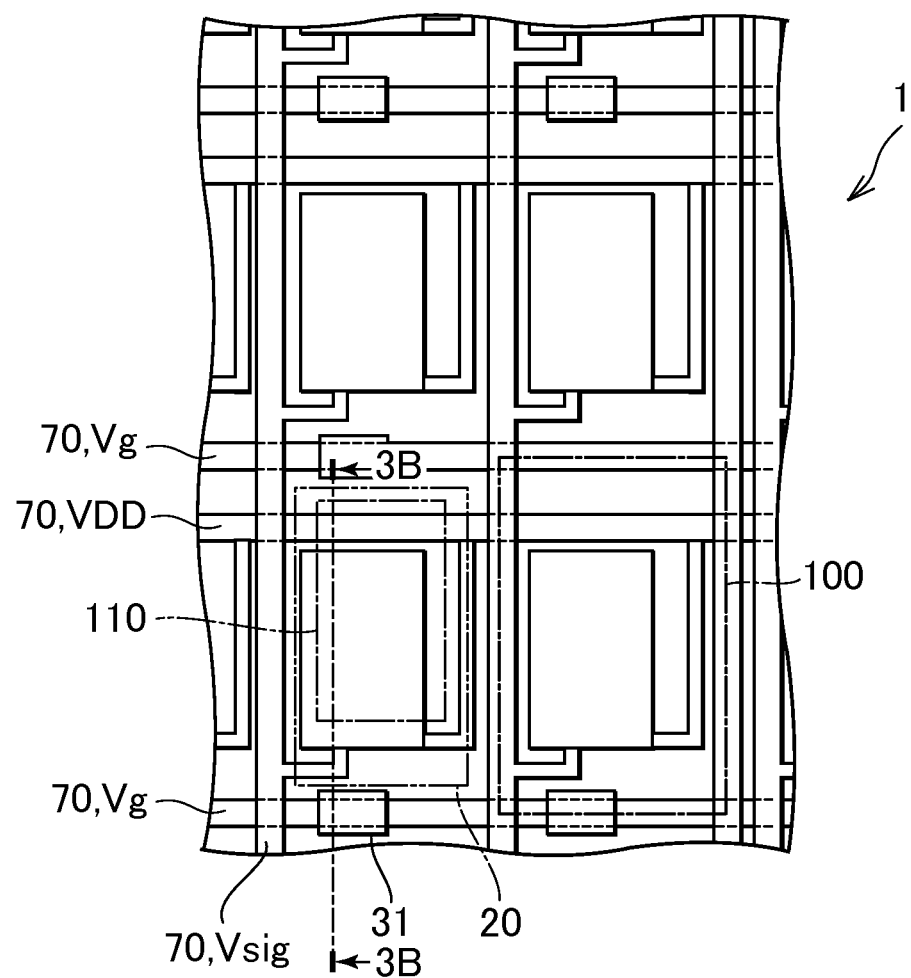
FIG. 3A is a plan view illustrating an example of an organic EL display device according to a second embodiment of the present invention.
Figure 3B:
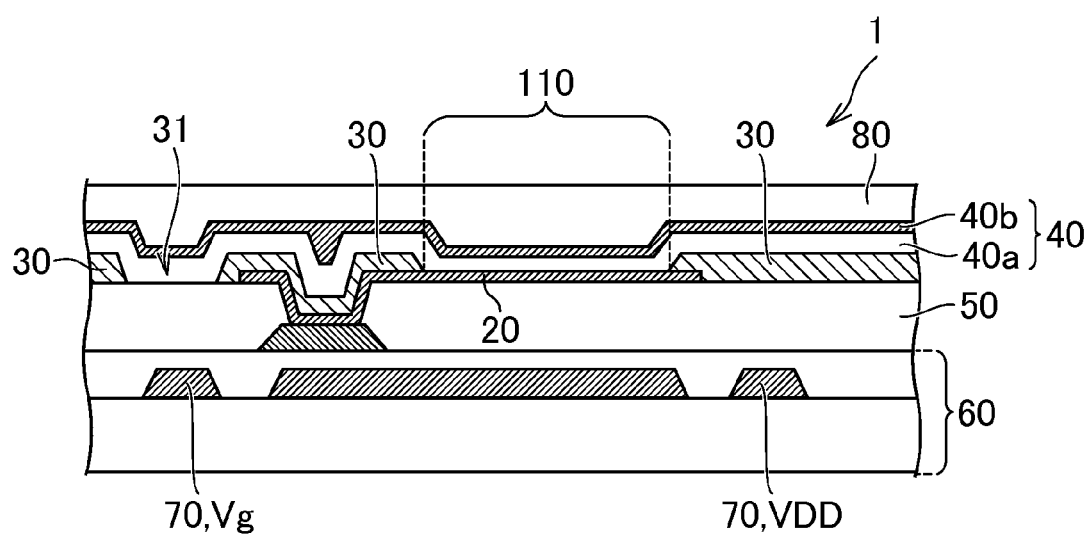
FIG. 3B is a cross-sectional view taken along a line 3B-3B in FIG. 3A.

FIG. 3A is a plan view illustrating an example of an organic EL display device 1 according to the second embodiment of the present invention. FIG. 3B is a cross-sectional view taken along a line 3B-3B in FIG. 3A.

As illustrated in FIG. 3A, the organic EL display device 1 according to the second embodiment has the first substrate 60 in which the plural pixel circuits 100 each having the thin film transistor are arranged on the insulating substrate in a matrix. In the plan view, the anodes 20 (pixel electrodes) are arranged at respective positions corresponding to the plural pixel circuits 100 arranged in a matrix, and pixel openings 110 are formed in partial or overall areas of the respective anodes 20.

As illustrated in FIG. 3A, the openings 31 are arranged in an area that overlaps with the gate electrode lines Vg (scanning lines) in the plan view. For that reason, the OLED layer 40 and the organic planarizing film 50 come in direct contact with each other in an area of the first substrate 60 which overlaps with the gate electrode lines Vg (scanning lines) that partition the plural pixel circuits 100 in the matrix in the plan view.

Because the lines 70 that partition the plural pixel circuits 100 in the matrix do not overlap with the pixel openings 110 in the plan view, the organic EL display device 1 is manufactured without interfering with the pixel opening areas, without causing the separation between the bank 30 and the organic planarizing film 50 or between the electrodes and the organic planarizing film 50 during manufacturing.

The method of manufacturing the organic EL display device 1 according to the second embodiment may be identical with the method of manufacturing the organic EL display device 1 according to the first embodiment except that the first step S-1a in the method of manufacturing the organic EL display device 1 according to the above first embodiment includes a step of forming the lines 70 that partition the plural pixel circuits 100 in the matrix, and the openings 31 formed in the fourth step S-1d are formed in the area that overlaps with the lines 70 in the plan view.

The organic EL display device 1 according to the second embodiment described above is a display device that improves the reliability of the organic EL film layer.

Also, the organic EL display device 1 according to the second embodiment having the organic planarizing film 50 made of the organic insulating material, and the inorganic bank 30 made of the inorganic insulating material is a display device that reduces the color mixture and improves the reliability of the organic EL film layer.

Third Embodiment

FIG. 4 is a plan view illustrating an organic EL display device 1 according to a third embodiment of the present invention. In the organic EL display device 1 according to the third embodiment, a plurality of the pixels illustrated in FIG. 1 described above are arranged to form a display area 12. A peripheral area 13 (an area marked with diagonal lines in FIG. 4) surrounding the display area 12 is formed outside of the display area 12. Lines for transmitting data to the respective pixels, and a dummy pixel that does not contribute to image display are arranged in the peripheral area 13.

Figure 5:
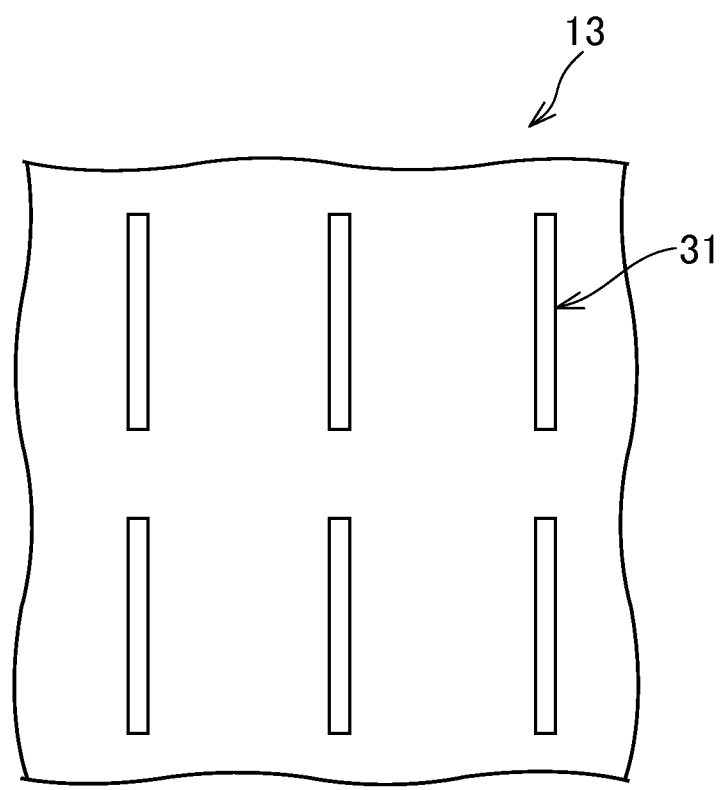
FIG. 5 is a partial plan view illustrating opening portions formed in an inorganic layer formed in a peripheral area in the organic EL display device according to the third embodiment of the present invention.
Figure 6:
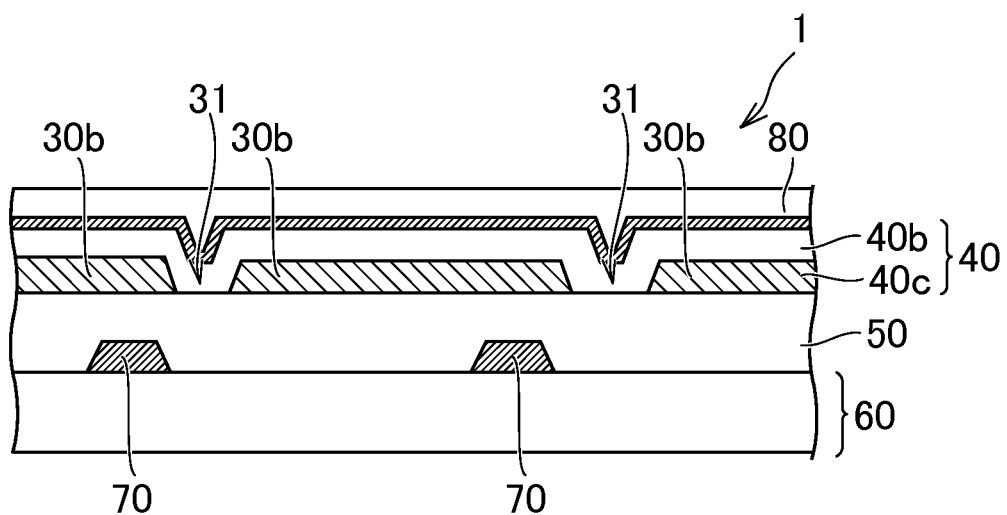
FIG. 6 is a cross-sectional view illustrating the peripheral area in the organic EL display device according to the third embodiment of the present invention.

FIG. 5 is a partial plan view illustrating openings 31 formed in an inorganic layer formed in the peripheral area 13 in the organic EL display device according to the third embodiment. FIG. 6 is a cross-sectional view illustrating the peripheral area 13 in the organic EL display device according to the third embodiment. A planarizing film 50 made of an organic material is formed to cover lines 70 on a TFT substrate 60. An inorganic (SiN) layer 30b of the same layer as that of the bank is arranged on the organic planarizing film 50 to cover the organic planarizing film 50. Openings 31 are formed in parts of the inorganic layer 30b, and the organic layer 40c of the same layer as that of the light emitting layer 40a comes in contact with the organic planarizing film 50 through the openings 31. In FIG. 4, the openings 31 in the peripheral area 13 have the same shape as that of the openings 31 in the display area 12. However, because the peripheral area 13 has no pixel opening unlike the display area 12, the openings 31 in the peripheral area 13 may be set to be larger than the pixel openings.

In the above configuration, the baking process illustrated in FIG. 2 can be implemented to remove the moisture contained in the organic planarizing film 50.

Fourth Embodiment

Figure 7:
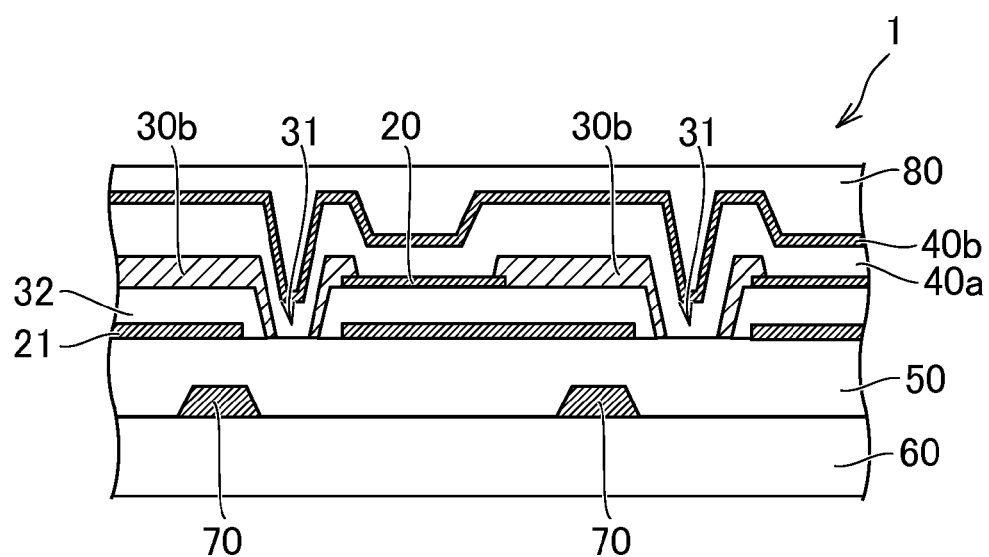
FIG. 7 is a cross-sectional view illustrating a pixel portion in an organic EL display device according to a fourth embodiment of the present invention.

FIG. 7 is a cross-sectional view illustrating a pixel portion in an organic EL display device according to a fourth embodiment. Parts having the same functions as those in the first embodiment are denoted by identical reference numerals.

In a pixel of FIG. 7, an electrode 21 is arranged in a lower layer of the anode 20 which is a pixel electrode through an insulating film 32. The electrode 21 forms a capacitor in cooperation with the anode 20 and the insulating film 32. On the other hand, a storage capacitor is also formed in a circuit layer formed in a lower layer of a planarizing film 50. The capacitor is formed by the electrode 21 and the anode 20 with the results that a capacitor formed in the circuit layer can be reinforced, and the pixel capacity can increase. In particular, when higher definition is advanced, and a given storage capacity cannot be ensured by only the capacitor formed in the circuit layer, the configuration of FIG. 7 can be employed to ensure a desired capacity.

In this embodiment, the inorganic insulating film 32 is formed to cover the capacitor electrode 21 formed on the organic planarizing film 50. The insulating film 32 is formed as a series of films partially having the openings 31. Also, the anodes 20 that are pixel electrodes are formed on the insulating film 32. The inorganic bank 30 is formed to cover the end of the anode 20 and the opening 31. The opening 31 is positioned with respect to the opening of the insulating film 32 in a part of the inorganic bank 30. As a result, the OLED layer 40a and the planarizing film 50 come into contact with each other through the opening 31. With this configuration, the moisture of the organic planarizing film 50 can be removed.

In this embodiment, the openings 31 are formed in parts of the inorganic insulating film 32 formed on an overall surface of the planarizing film 50, thereby being capable of removing the moisture contained in the planarizing film 50.

Figure 8:
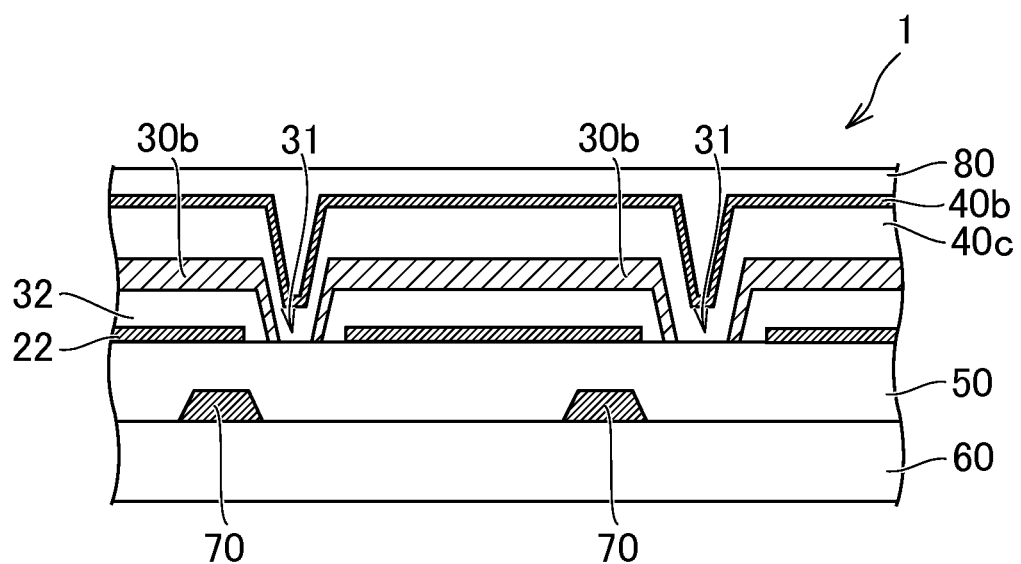
FIG. 8 is a cross-sectional view illustrating a peripheral area in the organic EL display device according to the fourth embodiment of the present invention.

FIG. 8 is a cross-sectional view illustrating a peripheral area 13 in the organic EL display device according to the fourth embodiment. A planarizing film 50 made of an organic material is formed to cover lines 70 on a TFT substrate 60. Lines 22 of the same layer as that of the capacitor electrode 21 are formed on the planarizing film 50, and an insulating film 32 is formed to cover the lines 22. Openings 31 are partially formed in the insulating film 32. Also, an inorganic (SiN) layer 30b of the same layer as that of the bank is arranged on the insulating film 32, and the opening 31 is formed in the inorganic layer 30b while being positioned with respect to the opening of the insulating film 32. An organic layer 40c and the planarizing film 50 come in contact with each other through the openings 31 formed in the inorganic layer 30b and the insulating film 32.

With the above configuration, the moisture contained in the planarizing film 50 can be removed.

Fifth Embodiment

Figure 9:
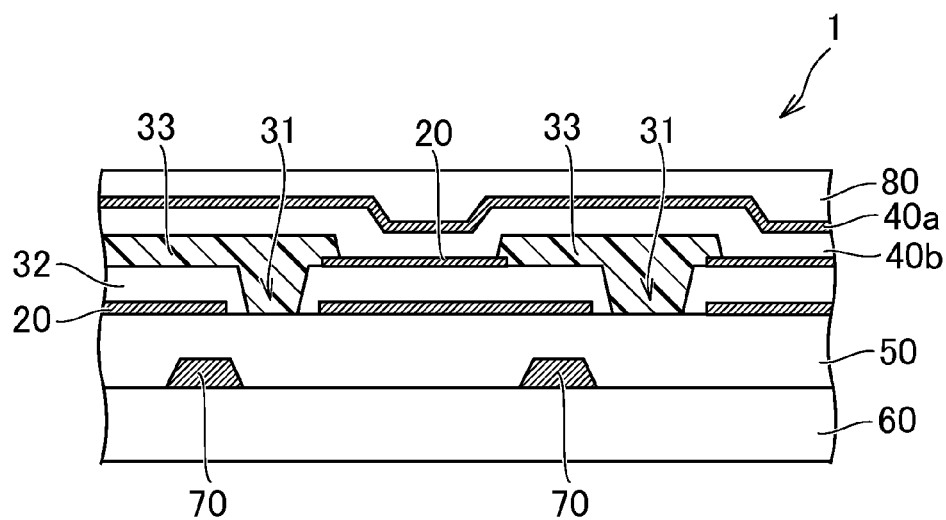
FIG. 9 is a cross-sectional view illustrating a pixel portion in an organic EL display device according to a fifth embodiment of the present invention.

FIG. 9 is a cross-sectional view illustrating a pixel portion in an organic EL display device according to a fifth embodiment. Parts having the same functions as those in the fourth embodiment are denoted by identical reference numerals.

In this embodiment, as in the fourth embodiment, an insulating film 32 is partially formed with openings 31 as a series of films to cover the electrode 21 forming a capacitor. Each anode 20 that is a pixel electrode is formed on the insulating film 32, and an insulating bank 33 is formed to cover the end of the anode 20, and the opening 31.

The insulating bank 33 is made of an organic material. A lower surface of the insulating bank 33 comes in contact with the planarizing film 50 in the openings 31, and an upper surface of the insulating bank 33 comes in contact with the OLED layer 40b. According to this embodiment, since the insulating bank 33 made of the organic material is intervened between the OLED layer and the planarizing film, the moisture of the planarizing film 50 can be removed without bringing the OLED layer into contact with the planarizing film 50. Also, steps caused by the insulating film can be reduced, and the OLED layer can be formed on the surface having a reduced number of steps. Since the steps are small, tearing of the OLED layer can be prevented.

In this embodiment, since the openings 31 are partially opened in the inorganic insulating film 32 formed over the entire surface of the organic planarizing film 50, the moisture contained in the planarizing film 50 can be removed.

Figure 10:
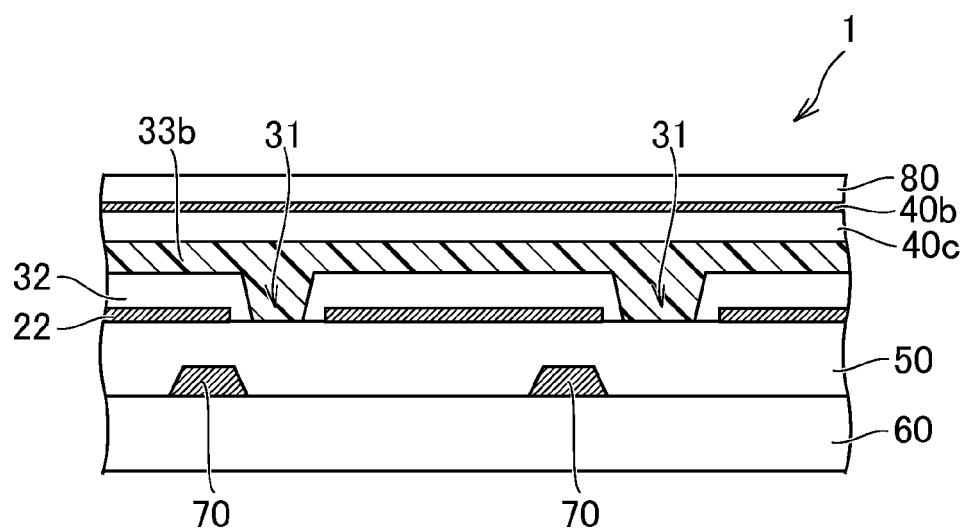
FIG. 10 is a cross-sectional view illustrating a peripheral area in the organic EL display device according to the fifth embodiment of the present invention.

FIG. 10 is a cross-sectional view illustrating a peripheral area 13 in an organic EL display device according to the fifth embodiment. A planarizing film 50 made of an organic material is formed to cover lines 70 on a TFT substrate 60. Lines 22 of the same layer as that of a capacitor electrode 21 are formed on the planarizing film 50. An insulating film 32 is formed to cover the lines 22. Openings 31 are partially formed in the insulating film 32.

An organic film 33b of the same layer as that of the insulating bank 33 is formed on the insulating film 32, and the organic planarizing film 50 and the organic film 33b come in contact with each other through the openings 31. Also, an organic layer 40c of the same layer as that of the OLED layer 40a is formed on an upper surface of the organic film 33b.

With the above configuration, the moisture contained in the planarizing film 50 can be removed.

Sixth Embodiment

Figure 11:
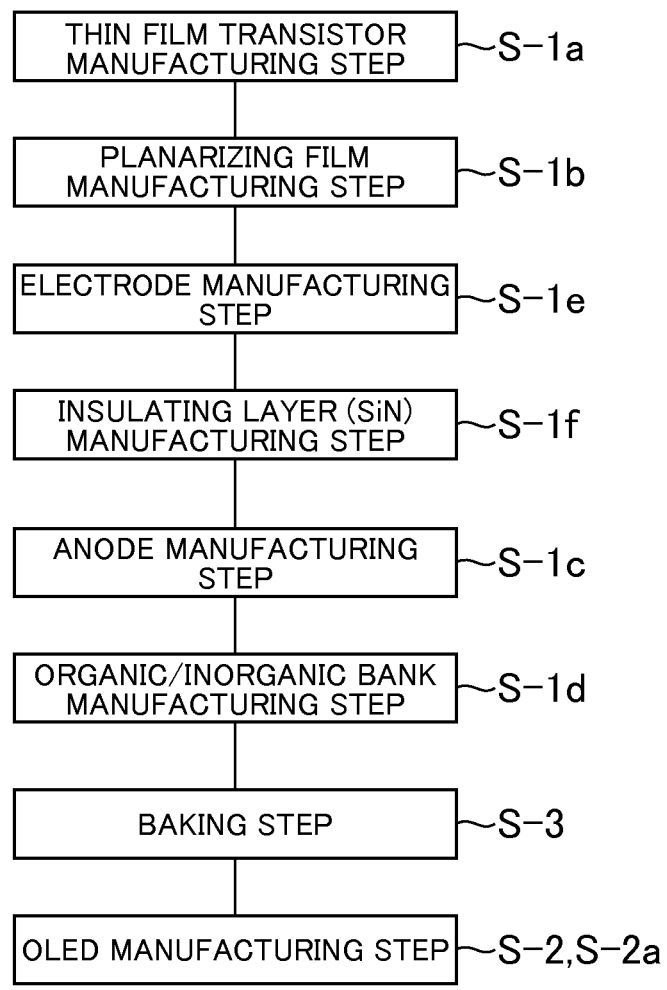
FIG. 11 is a diagram illustrating a manufacturing process of the organic EL display device according to the fourth embodiment and the fifth embodiment.

FIG. 11 is a diagram illustrating a manufacturing process of the organic EL display device 1 according to the fourth embodiment and the fifth embodiment. As in the step illustrated in FIG. 2, the step of manufacturing the display device according to the present invention is roughly classified into the TFT step (S-1) and the OLED step (S-2). Also, as in FIG. 2, the step of forming the anodes 20 formed on the planarizing film 50 and the bank is included in the TFT step (S-1).

Since the first step S-1a of forming the first substrate 60, and the second step S-1b of forming the planarizing film 50 are identical with those in the first embodiment, their description will be omitted. Also, in order to remove moisture contained in the planarizing film 50, a braking (or vacuum baking) process may be conducted, for example, under a condition of 200° C.

After the second step S-1b, an electrode manufacturing step S-1e of forming the capacitor electrode 21 and the lines 22 of the same layer as that of the capacitor electrode 21 is conducted. In the electrode manufacturing step S-1e, the capacitor electrode and the lines 22 are formed on a surface of the planarizing film 50 formed in the above-mentioned second step S-1b opposite to the first substrate 60 side.

Then, an insulating layer manufacturing step S-1f of coating the electrode 21 and the lines 22 formed in the electrode manufacturing step S-1e is conducted. In this step, the openings 31 are also formed.

Then, an anode manufacturing step S-1c of forming the anodes on the insulating film 32 formed in the insulating layer manufacturing step S-1f is conducted. The anodes 20 may be made of, for example, tin oxide ($SnO_2$), zinc oxide doped with aluminum (ZnO:Al), indium tin oxide (ITO), or indium zinc oxide ($In_2O_3$—ZnO(IZO)), and may be formed through a known photolithographic technology (PEP or lithography).

Then, an organic or inorganic bank manufacturing step (bank manufacturing step) S-1d of forming the bank 30 to cover the end of the anodes 20 formed by the above anode manufacturing step S-1c is conducted.

When the organic bank is formed, the organic bank is formed to embed the openings 31 formed in the insulating film manufacturing step S-1f. Also, the organic bank includes the pixel opening on the anodes 20.

In the case of the inorganic bank, the opening is formed in the inorganic bank while being positioned with respect to the openings 31 of the insulating film 32. The inorganic bank has the pixel opening above the anode 20.

As the method of forming the opening, the same method as that in the first embodiment can be applied.

Then, a baking step S-3 and an OLED manufacturing step S-2 are conducted. Because the baking step S-3 and the OLED manufacturing step S-2 are identical with those in the first embodiment, their details will be omitted.

The openings 31 are configured to ensure the escape of the moisture contained in the organic material forming the organic planarizing film 50. When the escape of moisture is thus ensured, the moisture is evaporated to the external without remaining within the organic planarizing film and expanding at the time of (vacuum) baking, to thereby lead to a reduction in a risk of causing the separation between the insulating film and the planarizing film, or between the electrode and the planarizing film.

The organic EL display device 1 according to this embodiment as described above is a display device that reduces the color mixture and improves the reliability of the organic EL film layer.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A display device, comprising:
   a first substrate in which a plurality of pixel circuits each having a thin film transistor are arranged on an insulating substrate in a matrix;
   an organic planarizing film that is made of an organic insulating material, and arranged on the first substrate;
   an electrode that comes in contact with a part of a surface of the organic planarizing film opposite to the first substrate side;
   an inorganic bank that is made of an inorganic insulating material, covers an end of the electrode, and comes in contact with a part of a surface of the organic planarizing film opposite to the first substrate side;
   an OLED layer that covers a side of the electrode and the inorganic bank opposite to a side that comes in contact with the organic planarizing film, and partially comes in contact with the organic planarizing film; and
   a sealing film that is configured to cover a side of the OLED layer opposite to the organic planarizing film side;
   wherein an inorganic bank opening portion is formed in the inorganic bank, and wherein the OLED layer comes in contact with the organic planarizing film through the inorganic bank opening portion;
   wherein the first substrate has lines for partitioning the plurality of pixel circuits in the matrix, and wherein the inorganic bank opening portion is arranged in an area that overlaps with the lines in a plan view.

2. The display device according to claim 1,
   wherein the inorganic insulating material of the inorganic bank is a material selected from a group consisting of silicon nitride, silicon oxide, and a mixture thereof.

3. The display device according to claim 1,
   wherein a thickness of the organic planarizing film is equal to or larger than 1.5 µm and equal to or smaller than 3.5 µm, and
   wherein a thickness of the inorganic bank is equal to or larger than 0.15 µm and equal to or smaller than 0.35 µm.

4. The display device according to claim 1,
   wherein the lines are lines selected from a group consisting of gate electrode lines scanning lines, signal lines, and power supply lines that supply a power to the thin film transistors, which are connected to gate electrodes, source electrodes, and drain electrodes included in thin film transistors, respectively.

5. A method of manufacturing a display device, comprising:
   forming a first substrate in which a plurality of pixel circuits each having a thin film transistor are arranged on an insulating substrate in a matrix as a first step;
   forming an organic planarizing film made of an organic insulating material on the first substrate as a second step;
   forming an electrode which comes in contact with a part of a surface of the organic planarizing film opposite to the first substrate side as a third step;
   forming an inorganic bank that is made of an inorganic insulating material, covers an end of the electrode, and comes in contact with a part of a surface of the organic planarizing film opposite to the first substrate side as a fourth step; and
   forming an OLED layer that covers a side of the electrode and the inorganic bank opposite to a side that comes in contact with the organic planarizing film, and partially comes in contact with the organic planarizing film as a fifth step;
   wherein the first step includes a step of forming lines for partitioning the plurality of pixel circuits in the matrix, and wherein an inorganic bank opening portion formed in the fourth step is arranged in an area that overlaps with the lines in a plan view.

6. The method of manufacturing a display device according to claim 5,
   wherein the fourth step includes a step of forming an inorganic bank opening portion in the inorganic bank, and exposing a part of a surface of the organic planarizing film opposite to the first substrate side, and
   wherein the fifth step includes a step of forming the OLED layer that comes in contact with and covers the part of the surface of the organic planarizing film opposite to the first substrate side, and the surface of the inorganic bank opposite to the planarizing film side.

7. The method of manufacturing a display device according to claim 5,
   wherein the inorganic insulating material of the inorganic bank is a material selected from a group consisting of silicon nitride, silicon oxide, and a mixture thereof.

8. The method of manufacturing a display device according to claim 5,
   wherein a thickness of the organic planarizing film is equal to or larger than 1.5 µm and equal to or smaller than 3.5 µm, and
   wherein a thickness of the inorganic bank is equal to or larger than 0.15 µm and equal to or smaller than 0.35 µm.

9. The method of manufacturing a display device according to claim 5,
   wherein the lines are any lines selected from scanning lines, signal lines, and power supply lines that supply a power to the thin film transistors, which are connected to gate electrodes, source electrodes, and drain electrodes included in thin film transistors, respectively.

* * * * *